(12) United States Patent
Son et al.

(10) Patent No.: US 11,940,494 B2
(45) Date of Patent: Mar. 26, 2024

(54) SYSTEM ON CHIP FOR PERFORMING SCAN TEST AND METHOD OF DESIGNING THE SAME

(71) Applicant: SAMSUNG ELECTRONICS CO., LTD., Suwon-si (KR)

(72) Inventors: Woohyun Son, Suwon-si (KR); Kiseok Bae, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 21 days.

(21) Appl. No.: 17/859,870

(22) Filed: Jul. 7, 2022

(65) Prior Publication Data
US 2023/0141786 A1   May 11, 2023

(30) Foreign Application Priority Data

Nov. 11, 2021 (KR) .................. 10-2021-0154762
Mar. 18, 2022 (KR) .................. 10-2022-0033736

(51) Int. Cl.
| | | |
|---|---|---|
| G06F 30/333 | (2020.01) | |
| G01R 31/317 | (2006.01) | |
| G01R 31/3185 | (2006.01) | |
| G01R 31/3193 | (2006.01) | |

(52) U.S. Cl.
CPC ......... G01R 31/318597 (2013.01); G01R 31/31719 (2013.01); G01R 31/31727 (2013.01); G01R 31/31935 (2013.01)

(58) Field of Classification Search
USPC ...................... 716/104, 106, 136
See application file for complete search history.

(56) References Cited

U.S. PATENT DOCUMENTS

| | | | |
|---|---|---|---|
| 6,389,567 B2 | 5/2002 | Porteners et al. | |
| 8,055,965 B2 | 11/2011 | Kaneko | |
| 8,127,188 B2 | 2/2012 | Haegawa | |
| 8,438,436 B1 * | 5/2013 | Baker | G01R 31/318588 |
| | | | 714/34 |
| 8,621,295 B2 | 12/2013 | Tamiya | |
| 2005/0039039 A1 | 2/2005 | Moyer et al. | |

(Continued)

FOREIGN PATENT DOCUMENTS

| | | | | |
|---|---|---|---|---|
| EP | 2316041 B1 * | 5/2011 | ....... | G01R 31/31719 |
| JP | 2009-192408 A | 8/2009 | | |
| KR | 10-2019-0083996 A | 7/2019 | | |

*Primary Examiner* — Brian Ngo
(74) *Attorney, Agent, or Firm* — Fish & Richardson P.C.

(57) ABSTRACT

A system on chip includes a one-time programmable (OTP) memory configured to store secure data, an OTP controller including at least one shadow register configured to read the secure data from the OTP memory and to store the secure data, a power management unit configured to receive an operation mode signal from an external device and to output test mode information indicating whether an operation mode is a test mode according to the operation mode signal and a test valid signal corresponding to the secure data, and a test circuit configured to receive the test mode information from the power management unit, to receive test data from the external device, and to output a scan mode signal and a test mode signal according to the test data and a test deactivation signal, wherein the test deactivation signal corresponds to development state data indicating a chip development state in the secure data.

15 Claims, 8 Drawing Sheets

(56) References Cited

U.S. PATENT DOCUMENTS

| | | | |
|---|---|---|---|
| 2010/0107023 A1* | 4/2010 | Guettaf | G01R 31/31719 |
| | | | 714/728 |
| 2014/0245252 A1* | 8/2014 | Chan | G01R 31/318575 |
| | | | 716/136 |
| 2015/0067425 A1* | 3/2015 | Kim | G01R 31/31705 |
| | | | 714/727 |
| 2019/0293719 A1 | 9/2019 | Sugimoto | |
| 2023/0096746 A1* | 3/2023 | Woo | G01R 31/318544 |
| | | | 702/58 |

* cited by examiner

SYSTEM ON CHIP FOR PERFORMING SCAN TEST AND METHOD OF DESIGNING THE SAME

CROSS-REFERENCE TO RELATED APPLICATION(S)

This application claims the benefit of priority to Korean Patent Application No. 10-2021-0154762 filed on Nov. 11, 2021 and Korean Patent Application No. 10-2022-0033736 filed on Mar. 18, 2022 in the Korean Intellectual Property Office, the disclosures of which are incorporated herein by reference in their entirety.

BACKGROUND

Exemplary embodiments of the present disclosure relate to a system on chip for performing a scan test, and a method of designing the same.

Generally, in a system on chip (SoC), a system having several functions may be implemented as a single semiconductor chip, and a design for test (DFT) technique has been used to test logic circuits included in the SoC. Among DFT techniques, a scan test may be a technique for testing a logic circuit by checking data output based on input scan pattern data. A stuck fault, a transition delay fault, and the like of a logic circuit may be determined based on the scan test.

SUMMARY

An exemplary embodiment of the present disclosure is to provide a system on a chip which may improve availability of a scan test, and a method of designing the same.

An exemplary embodiment of the present disclosure is to provide a system on a chip which may improve performance of a design for test (DFT) verification, and a method of designing the same.

According to an exemplary embodiment of the present disclosure, a system on chip includes a one-time programmable (OTP) memory configured to store secure data; an OTP controller including at least one shadow register configured to read the secure data from the OTP memory and to store the secure data; a power management unit configured to receive an operation mode signal from an external device and to output test mode information indicating whether an operation mode is a test mode according to the operation mode signal and a test valid signal corresponding to the secure data; and a test circuit configured to receive the test mode information from the power management unit, to receive test data from the external device, and to output a scan mode signal and a test mode signal according to the test data and the test deactivation signal, wherein the test deactivation signal corresponds to development state data indicating a chip development state in the secure data.

According to an exemplary embodiment of the present disclosure, a system on chip includes a first combinatorial logic; a second combinatorial logic; a third combinatorial logic; first scan flip-flops connected between the first combinational logic and the second combinational logic; second scan flip-flops connected between the second combinational logic and the third combinational logic; a scan control flip-flop configured to receive output data of the second combinational logic and to transfer the output data to the third combinational logic; a scan chain configured to receive scan data and including the first scan flip-flops and the second scan flip-flops; and a multiplexer configured to output one of an output signal of the scan chain and an output signal of the third combinational logic in response to a scan mode signal, wherein the scan control flip-flop is designed such that the output data does not affect a scan operation in a scan mode.

According to an exemplary embodiment of the present disclosure, a method of designing a system on chip includes defining one-time programmable (OTP) data in a specification; indicating whether the OTP data affects test or debugging access; and designing a shadow register using scan control flip-flops in storing the OTP data when the OTP data affects the test or debugging access, wherein each of the scan control flip-flops is designed such that output data does not affect the scan operation in the scan mode.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION OF THE PREFERRED EMBODIMENTS

Hereinafter, embodiments of the present disclosure will be described below with reference to the accompanying drawings.

Generally, a system on chip (SoC) includes a One-time Programmable (OTP) memory to safely store a value used therein. Secure data stored in the OTP memory may include a security key for booting, trim information for correcting of a sensor value, information for a memory repair system, and development state data. The development state data may be used to classify a development state of the SoC, that is, for example, a development stage, a test stage, and a mass production stage. The SoC may use the development state data to switch operating modes. Generally, an operation mode of the SoC may include a function mode and a test mode. The test mode may be used for design for test (DFT).

For secure DFT, after data in the OTP memory is actually loaded, an operation mode may need to be switched. The switching of the operation mode may be determined as a valid signal output from the OTP controller. During a scan test, the development state data may be shaken, such that the mode may be switched to an unintended mode, and accordingly, test efficiency may be reduced.

Figure 1:
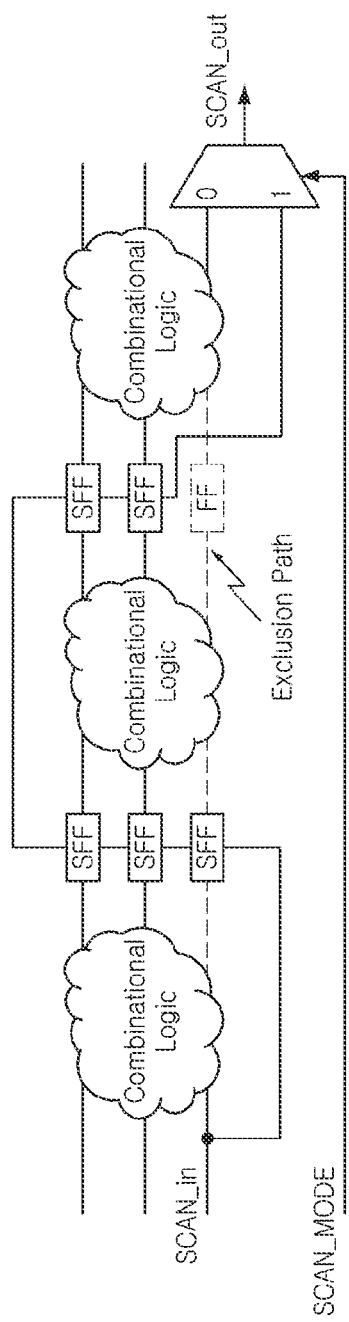
FIG. 1 is a diagram illustrating a scan chain circuit of a general system on chip according to an exemplary embodiment of the present disclosure.

FIG. 1 is a diagram illustrating a scan chain circuit of a general system on chip according to an exemplary embodiment. Referring to FIG. 1, when synthesizing a design, flip-flops which may have an effect may be excluded from a scan chain. However, data of the corresponding flip-flop may still be shaken by combinatorial logic during the "updating" process of the scan test. Generally, a process of reading and writing data in the OTP memory in software may be performed for a relatively long time. For this reason, when the SoC is booted, a process of sensing OTP data to a shadow register may be performed. The data in the shadow register may be used for an operation of the SoC (a boot-related operation, a security-related operation, a repair-related operation, or the like).

As a scheme for DFT (Design for Test) such as IEEE 1149.1 has been strengthened, a scan test for testing presence or absence of defects in flip-flops and gates (AND, OR, XOR, or the like) may be necessary. The flip-flops may be tested by applying random data to a first input terminal by connecting the entirety of the flip-flops to a chain, and comparing the data by extracting the applied data on an output terminal. The data may be applied to the connected scan chain, the scan chain may be released and a functional mode may operate (updating), such that it may be checked whether the gate operates with the logic intended by a designer.

The shadow register of the OTP may include a plurality of flip-flops. For this reason, a scan test may be necessary. However, among the shadow registers, a predetermined register (a register storing data used to identify the development state) should not be connected to a scan chain. This is because the flip-flop is tested using random data, and accordingly, even in the development stage, the stage may be recognized as a stage for mass production such that testing may not be performed. Also, when testing gates as well as scan chains, the issue in which specific registers may be overwritten with unintended data by combinatorial logic. The issues may degrade performance of DFT verification and may lead to security holes, such that it may be difficult to perform DFT verification and may weaken security. To address the issue, generally, a function engineering change order (ECO) may be performed to exclude the flip-flop from the scan chain. However, by using only a vector fixing data so as not to be shaken in a SCAN capture operation, the test coverage may be significantly reduced.

The exemplary embodiment discloses a system on a chip which may improve DFT verification performance/test availability, an electronic device having the same, and a method of operating the same. The system on chip in an exemplary embodiment may be implemented (designed) such that data of a flip-flop which may affect a test may not be shaken during a test operation. For example, the system on chip in the exemplary embodiment may be implemented such that data of a specific register (e.g., shadow register) may not be updated by a combinational logic during the scan test operation using a feedback loop flip-flop or a gating clock flip-flop. Also, the system on chip in an exemplary embodiment may be designed such that a flip-flop affecting a test may not be connected to a scan chain when a design is synthesized.

The system on chip in an exemplary embodiment may enable a stable test by preventing specific data from being updated by an "update" item (a combinational logic test) during a scan test. Also, the system on chip in an exemplary embodiment may enable a stable test by preventing data of a specific flip-flop from being updated by a "shifting" item during a scan test.

In the system on a chip, and a method for designing the same in an exemplary embodiment, OTP data affecting a design for test (DFT)/debugging element may be excluded from a scan test, such that an unintended issue may be managed to not occur, and secure DFT control may be performed on the scan chain to ensure that specific data may not be updated due to the action of a combinatorial logic.

Figure 2:
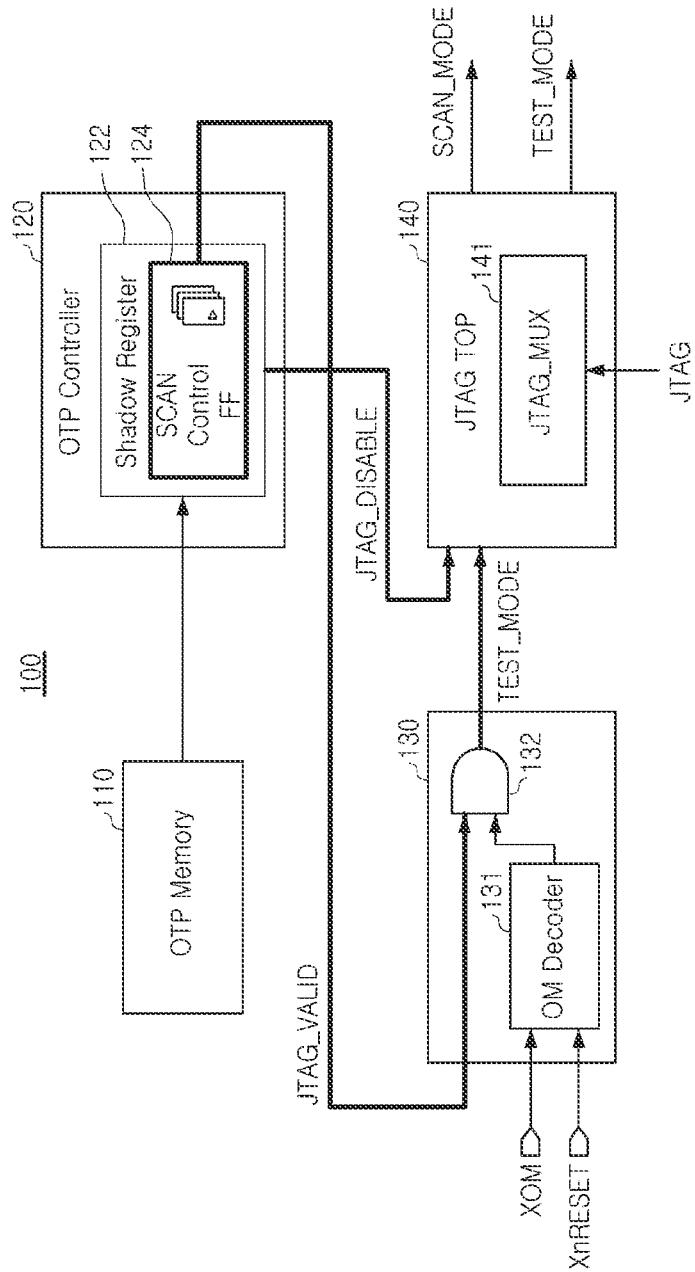
FIG. 2 is a diagram illustrating a system on chip according to an exemplary embodiment of the present disclosure.

FIG. 2 is a diagram illustrating a system on chip 100 according to an exemplary embodiment. Referring to FIG. 2, the system on chip 100 may include an OTP memory 110, an OTP controller 120, a power management unit 130 (PMU), and a test circuit 140 (JTAG TOP).

The OTP memory 110 may be implemented to store secure data. The secure data may include a boot key, trim information, recovery information, or development state data. The OTP memory 110 may include a plurality of memory cells connected to word lines and bit lines. The plurality of memory cells may not lose programmed data even when power is cut off, and may have irreversible properties such that the memory cells may not be reprogrammed. For example, each of the memory cells may be implemented as a fuse or an antifuse.

OTP controller 120 may be implemented to control the OTP memory 110. The OTP controller 120 may include at least one shadow register 122. Data included in the secure DFT may be loaded into the shadow register 122 of the OTP controller 120. During the scan test, the OTP controller 120 may be implemented as a scan control flip-flop 124 in which data in the shadow register 122 is not toggled such that the DFT environment may not be deactivated. For example, data in the shadow register 122 may be controlled using clock gating or a feedback loop.

In an exemplary embodiment, DFT/Debug access may be controlled according to the life-cycle data of the OTP memory 110 without clock gating or a feedback loop in a normal mode. To distinguish the normal mode from the test mode, a mode may be switched to the test mode by receiving a valid signal (JTAG_VALID) indicating that the data output from the OTP memory 110 is valid.

Also, the OTP controller 120 may read the secure data from the OTP memory 110. For example, the OTP controller 120 may be implemented to output a valid signal (JTAG_VALID) when reading secure data related to JTAG (DFT)/debugging.

The power management unit 130 may be implemented to receive power from an external device and to supply power to the SoC 100. Also, the power management unit 130 may receive an operation mode signal (XOM) and a reset signal (XnRESET) from an external device, may receive a test valid signal (JTAG_VALID) from the shadow register 122 of the OTP controller 120, and may output test mode information.

In an exemplary embodiment, the sequence for DFT may be as below. The power management unit 130 may receive a value for the test mode using the operation mode signal XOM, which is an external input. The operation mode (OM) decoder 131 of the power management unit 130 may receive the mode signal XOM and the reset signal XnRESET, may interpret the received mode signal XOM, and may confirm that a test mode TEST_MODE is prepared. The power management unit 130 may include a logic circuit 132 performing an AND operation on an output signal of the OM decoder 131 and a test valid signal JTAG_VALID from the shadow register 122 and outputting test mode information.

Also, the AND operation circuit 132 of the power management unit 130 may perform the "AND" operation on the valid signal (JTAG_VALID) received from the OTP controller 120 and the signal received from the OM decoder 131, thereby outputting the operation mode has been switched to the test mode.

The test circuit 140 (JTAG TOP module) may receive test data from an external JTAG interface using the JTAG MUX 141. Also, the test circuit 140 may determine each test mode according to the received data. For example, the test circuit 140 may receive test mode information from the power management unit 130, may receive a test disable signal JTAG_DISABLE from the shadow register 122 of the OTP controller 120, may receive test data from the JTAG interface, and may output a scan mode signal SCAN_MODE and a test mode signal TEST_MODE. The scan mode signal SCAN_MODE may include a value indicating a scan operation, and the test mode signal TEST_MODE may include a value indicating a test operation.

Generally, secure data such as a test disable signal JTAG_DISABLE stored in the OTP memory may distinguish the development state of the SoC. In the development stage, a test mode may be present for system on chip debugging. In the actual mass production stage, a mode may be determined to not be switched to the test mode. In the test mode, the internal data of the SoC may be processed, and this is because key data related to security may be read. Among these test items, there may be a scan test for testing flip-flops and gates, which are elements included in the SoC. The SoC may be tested using random data, and in this case, the flip-flop storing the test disable signal JTAG_DISABLE may change to "1" even in the development stage, and the scan chain may be released, such that the circuit may not be able to be tested. To prevent this, the OTP controller 120 in an exemplary embodiment may replace the flip-flop storing related data in the shadow register 122 with a feedback flip-flop, or the flip-flop may be implemented as a secure DFT control circuit using clock gating, that is, a scan control flip-flop 124

Generally, the OTP memory may store data indicating a development stage (life-cycle). During the stage of booting a product, OTP data may be loaded into the shadow register. During the scan test, the data in the shadow register may be toggled, which may turn off the DFT/debug function.

The system on chip 100 in an exemplary embodiment may include a scan control flip-flop 124 turning on/off DFT/debug-related functions for each stage of development of a product or controlling step-by-step, such that availability may improve. Also, the system on chip 100 in an exemplary embodiment may fix secure data of the shadow register using a clock gating method or a feedback loop method in the OTP controller 120.

Figure 3:
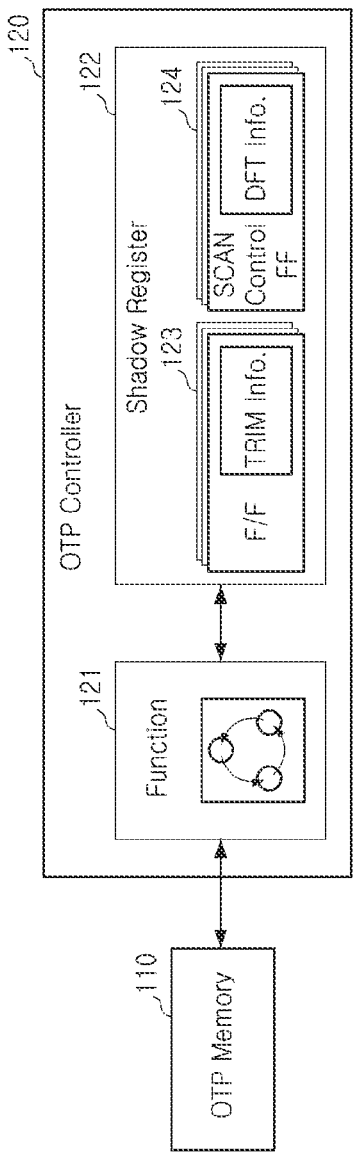
FIG. 3 is a diagram illustrating an OTP controller according to an exemplary embodiment of the present disclosure.

FIG. 3 is a diagram illustrating an OTP controller according to an exemplary embodiment. Referring to FIG. 3, the OTP controller 120 may include a function register 121 and a shadow register 122.

The function register 121 may include at least one flip-flop configured to store data for performing functions of the OTP controller 120.

The shadow register 122 may include at least one flip-flop 123 configured to store trim information and at least one scan control flip-flop 124 configured to store DFT information.

As illustrated in FIG. 3, in the OTP controller 120, data that may affect DFT (debug) access may be implemented by applying the scan control flip-flop 124 in the shadow register 122. In a general OTP controller, only flip-flops may be present between combinational logic. Accordingly, when data is updated by the combinational logic during the scan test, the data of the flip-flops may also be updated. Differently from this example, in the exemplary embodiment, the OTP controller 120 may include a shadow register 122 (see FIG. 1) implemented as a scan control flip-flop in which data is not updated by a combinational logic.

Figure 4:
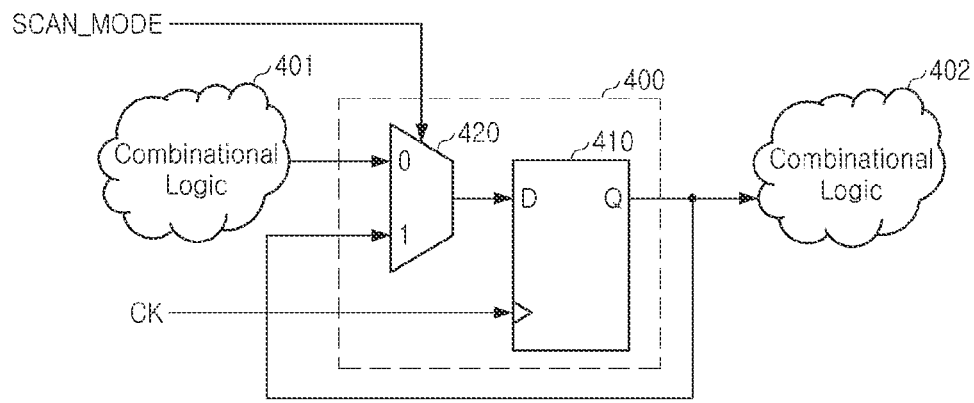
FIG. 4 is a diagram illustrating a scan control flip-flop according to an exemplary embodiment of the present disclosure.

FIG. 4 is a diagram illustrating a scan control flip-flop according to an exemplary embodiment. Referring to FIG. 4, the scan control flip-flop 400 may include a flip-flop 410 and a multiplexer 420. In an exemplary embodiment, the scan control flip-flop 400 may receive output of the first combinational logic 401 and may transmit an input to the second combinational logic 402. By disposing a 2×1 multiplexer 420 on a front end of the flip-flop 410, the combinational logic 401 may be affected when operating in a mode other than the scan chain. When operating as a scan chain, a feedback loop may be formed by connecting an output of the flip-flop 410 to an input. Accordingly, current data of the flip-flop 410 may be maintained. Accordingly, the data of the flip-flop 410 may not be randomly updated.

Figure 5:
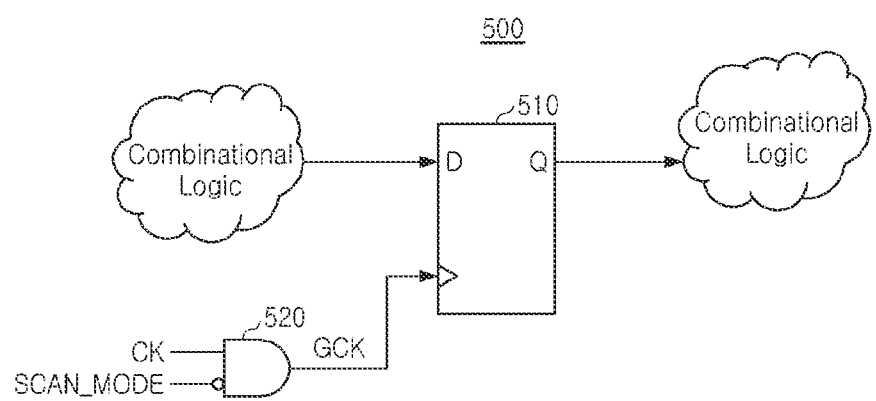
FIG. 5 is a diagram illustrating a scan control flip-flop according to another exemplary embodiment of the present disclosure.

FIG. 5 is a diagram illustrating a scan control flip-flop according to another exemplary embodiment. Referring to FIG. 5, the scan control flip-flop 500 may include a flip-flop 510 and an AND gate circuit 520.

As illustrated in FIG. 5, by arranging the AND gate circuit 520 on a clock terminal applied to the flip-flop 510, a common clock signal may be used when operating in a mode other than the scan chain. Also, current data of the flip-flop 510 may be maintained by gating the clock signal when operating as a scan chain. That is, during the scan chain, data in the flip-flop 510 may not be arbitrarily updated.

Figure 6:
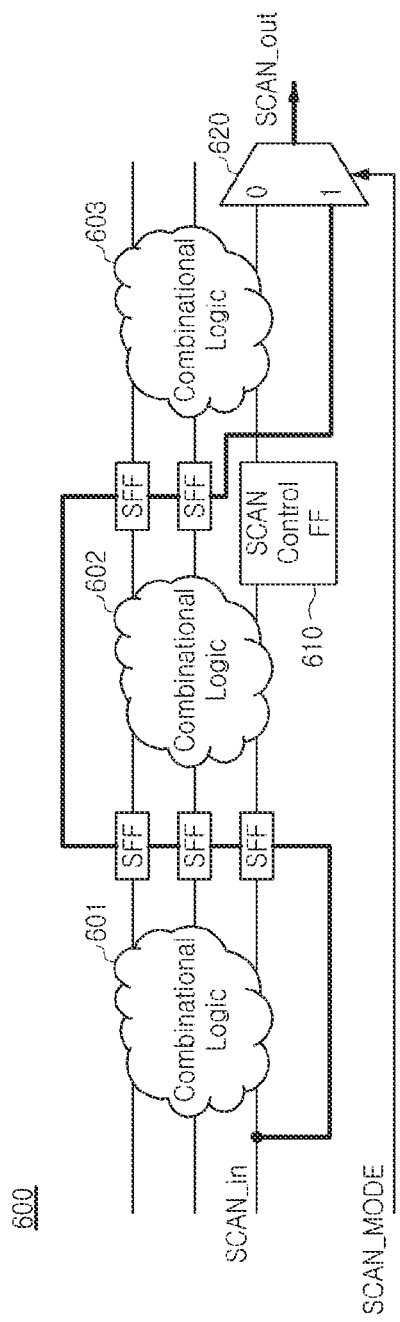
FIG. 6 is a diagram illustrating a scan chain circuit according to an exemplary embodiment of the present disclosure.

FIG. 6 is a diagram illustrating a scan chain circuit according to an exemplary embodiment. Referring to FIG. 6, the scan chain circuit may include a first combinational logic 601, a second combinational logic 602, a third combinational logic 603, scan flip-flops SFFs, a scan control flip-flop 610 and a multiplexer 620.

The scan flip-flops SFFs may include first scan flip-flops and second scan flip-flops forming a scan chain. The first scan flip-flops may be connected between the first combinational logic 601 and the second combinational logic 602. Also, the second scan flip-flops may be connected between the second combinational logic 603 and the third combinational logic 603. The scan chain may receive scan data during a scan operation and may output corresponding data.

The scan control flip-flop 610 may be implemented to receive output data of the second combinational logic 602 and to transfer the output data to the third combinational logic 603. The scan control flip-flop 610 may be excluded from the scan chain as illustrated in FIG. 6. In an exemplary embodiment, the scan control flip-flop 610 may be designed such that output data of the combinational logic may not affect the scan operation in the scan mode, as described with reference to FIGS. 2 to 6.

The multiplexer 620 may be implemented to output one of an output signal of the scan chain and an output signal of the third combinational logic 603 in response to the scan mode signal SCAN_MODE.

As illustrated in FIG. 6, a flip-flop which may affect the test, may be excluded from the scan chain. Also, by replacing the flip-flop 610 using a feedback loop, the test may be stably performed.

Figure 7:
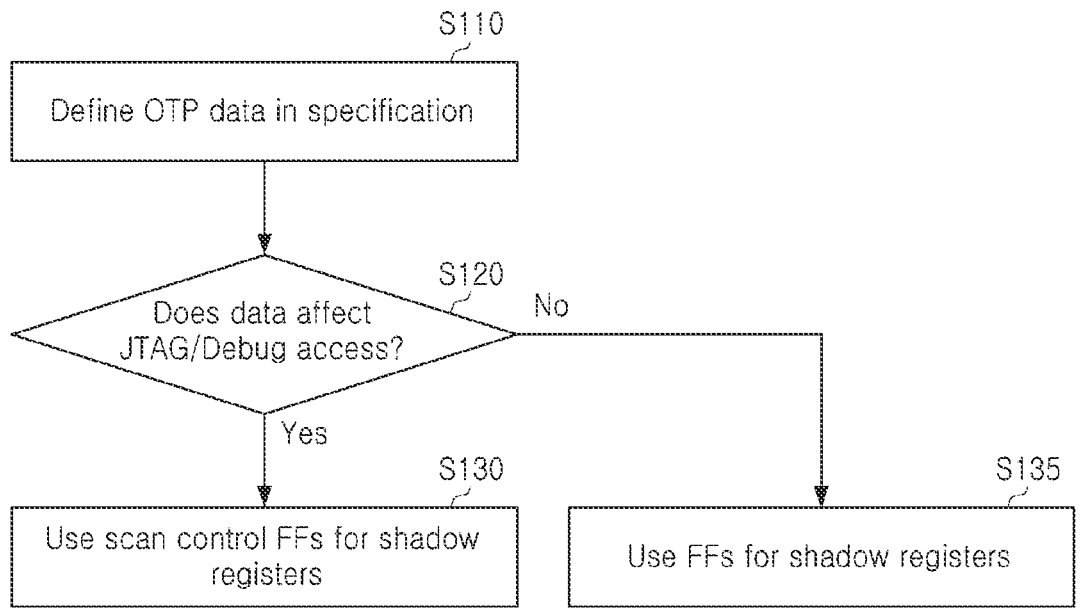
FIG. 7 is a flowchart illustrating a method of designing an OTP controller according to an exemplary embodiment of the present disclosure.

FIG. 7 is a flowchart illustrating a method of designing an OTP controller according to an exemplary embodiment. Referring to FIG. 7, a method of designing an OTP controller may be performed as below. A specification of data to be stored in the OTP memory 110 (see FIG. 2) may be defined (S110). It may be determined whether the corresponding data affects JTAG/Debug access (S120). When the corresponding data is data affecting JTAG/Debug access, the shadow register 122 (see FIG. 2) may be designed using the scan control flip-flops 124 (see FIG. 2) (S130). When the corresponding data does not affect JTAG/Debug access, the shadow register 122 may be designed by flip-flops (S135). By repeating the above-described processes, the OTP controller 120 (see FIG. 2) may be designed.

In an exemplary embodiment, the scan control flip-flops 124 may be excluded from the scan chain. In an exemplary embodiment, each of the scan control flip-flops 124 may be implemented as the feedback loop flip-flop 400 illustrated in FIG. 4 or may be implemented as the gating clock flip-flop 500 illustrated in FIG. 5.

In a general digital hardware design, a register transfer level (RTL) design may be performed according to a specification, a netlist design may be performed, a layout design may be performed, a chip may be manufactured using the layout data, and the manufactured chip may be tested. Generally, the specification describes the requirements for each function of hardware. The functions described in the specification are described using a hardware description language (HDL) such as Verilog or a very high-speed integrated circuit hardware description language (VHDL). In the register transfer level (RTL) design stage, hardware components with modularity and flexibility may be designed. Each of the components may be connected to a description library included in timing constraints related to voltage and environmental factors. In the netlist design stage, by verifying equivalence between the RTL design and the netlist design, it may be verified that the designed function is not modified by synthesis. Also, the timing between the components may be verified using a static timing analysis (STA). Each component of the description library may be mapped to an analog model described using layers (e.g., silicon-based semiconductors). Thereafter, overall components may be disposed in a predetermined region and may be routed (interconnected) to the metal layer. In the layout design stage, the overall layout may be compared with the netlist design through layout-to-circuit (LVS) verification. Also, it may be verified as to whether the designed layout may be manufactured through design rule check (DRC). Thereafter, a chip may be manufactured according to the designed layout, that is, the layout data. Thereafter, the test may be performed. A custom design may be performed according to a similar process after the gate unit circuit is completed. High level design (HLD) of the memory device may be performed using a computing device. The circuit designed by HLD may be expressed more specifically by RTL coding or simulation. The code generated by RTL coding may be converted into a netlist, and may be arranged and synthesized into an entire semiconductor memory. The synthesized schematic circuit may be verified by a simulation tool, and an adjustment process may be accompanied according to the verification result.

Generally, electronic design automation (EDA) may be a software application which a designer/manufacturer may use to design an electronic device. A large number of software applications may be used to design, simulate, analyze, and verify electronic devices prior to manufacturing on an integrated circuit or a semiconductor substrate.

Figure 8:
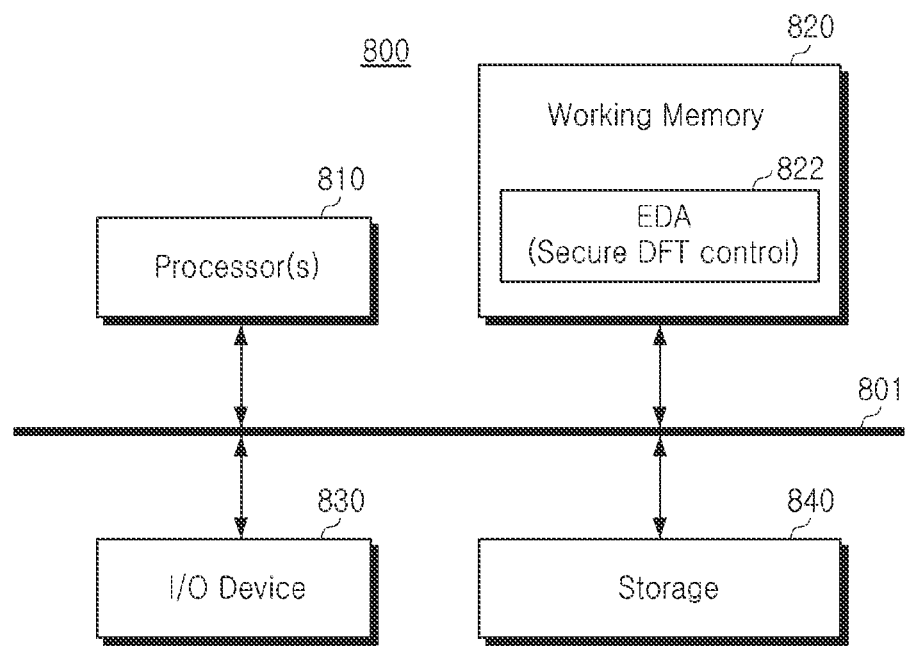
FIG. 8 is a block diagram illustrating a computing device running an EDA according to an exemplary embodiment of the present disclosure.

FIG. 8 is a block diagram illustrating a computing device running an EDA according to an exemplary embodiment. Referring to FIG. 8, the computing device 800 may include at least one processor 810, a working memory 820, an input/output device 830, and a storage device 840. The computing device 800 may be provided as a dedicated device for design. The computing device 800 may be configured to run various design and verification simulation programs.

The processor 810 may be implemented to execute software to be executed in the computing device 800. The processor 810 may execute an operating system OS loaded into the working memory 820. The processor 810 may execute various application programs to be run based on an operating system OS. In an exemplary embodiment, the processor 810 may execute an EDA tool. The EDA tool may include an RTL synthesis tool, a deployment tool, a clock tree synthesis tool, a routing tool, a verification tool, a netlist simulation tool, or a CDC tool. Also, the EDA tool may include the secure DFT control (scan control flip-flop) algorithm described with reference to FIGS. 2-7.

The working memory 820 may load an operating system OS or application programs. When the computing device 800 is booted, an OS image stored in the storage device 840 may be loaded into the working memory 820 according to a booting sequence. Overall input/output operations of the computing device 800 may be supported by the operating system OS. Also, the EDA tool 822 may be loaded into the working memory 820 from the storage device 840.

Also, the working memory 820 may include a volatile memory such as static random access memory (SRAM) or dynamic random access memory (DRAM). The working memory 820 is not limited thereto, and may include a non-volatile memory such as stage-change RAM (PRAM), magnetic RAM (MRAM), resistance RAM (ReRAM), ferroelectric RAM (FRAM), and flash memory or the like.

The input/output device 830 may be implemented to control a user input and output from user interface devices. For example, the input/output device 830 may include a keyboard or a monitor and may receive information from a designer. A designer may receive information about a semiconductor region or data paths requiring adjusted operating properties using the input/output device 830. Also, the processing process and the processing result of the simulation tool and the CDSC tool may be output to be displayed through the input/output device 830.

The storage device 840 may be provided as a storage medium of the computing device 800. The storage device 840 may store application programs (AP), an operating system image, and various data. The storage device 840 may be provided as a memory card (multimedia card (MMC), embedded MMC (eMMC), secure digital (SD), MicroSD, or the like) or a hard disk drive (HDD). The storage device 840 may include a NAND-type flash memory having a mass storage function. Alternatively, the storage device 840 may include a next-generation non-volatile memory such as PRAM, MRAM, ReRAM, FRAM, or NOR flash memory.

The system bus 801 may provide a network in the computing device 800. At least one processor 810, a working memory 820, an input/output device 850, and a storage device 840 may be electrically connected through the system bus 801, and data may be exchanged with each other.

When designing an OTP controller, the computer program product for electronic design automation in the design of the SoC in an exemplary embodiment may include a secure DFT control algorithm configured to exclude data affecting the scan test operation from the scan chain, or to output the corresponding data for stabilizing the flip-flop.

The method for designing the OTP controller of the SoC in an exemplary embodiment may enable efficient DFT control by designing a scan control circuit. The design method in the exemplary embodiment may enable a stable test using a feedback loop flip-flop or a gating clock flip-flop in a scan test among DFT items. Also, to determine whether OTP data related to mode change is actually detected, a test mode may be switched swiftly and safely without reading the entire OTP data using a valid signal (JTAG_VALID). Accordingly, the SoC development speed may be shortened. Also, flip-flops affecting DFT (debug) may be a potential risk factor which may be difficult to detect during scan testing, and by designing in consideration of this at the register transfer level (RTL) level, risk factors may be reduced in advance.

Meanwhile, the SoC in an exemplary embodiment may be applied to a computing system.

Figure 9:
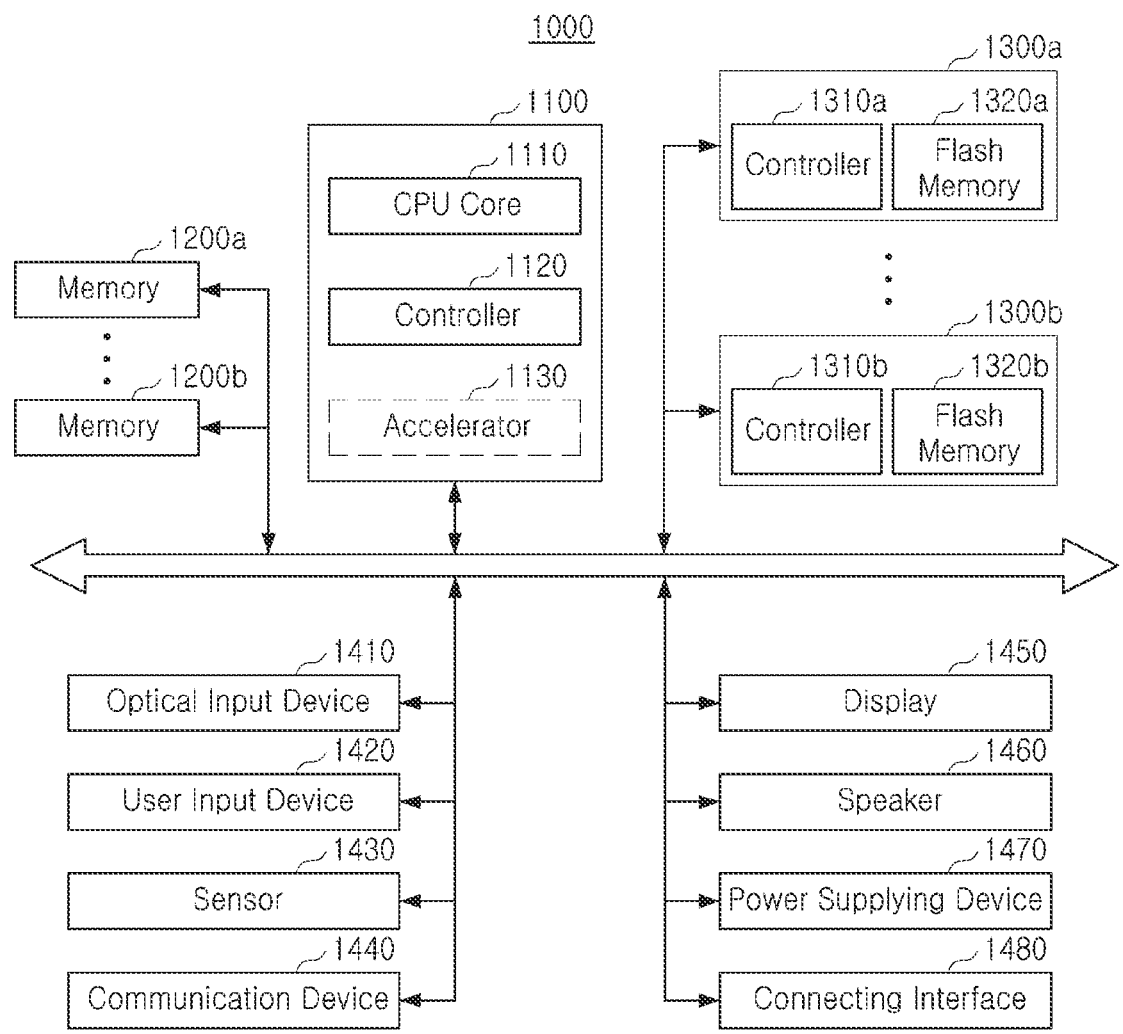
FIG. 9 is a diagram illustrating a computing system according to an exemplary embodiment of the present disclosure.

FIG. 9 is a diagram illustrating a computing system according to an exemplary embodiment. Referring to FIG. 9, the computing system 1000 may include a main processor 1100, memories 1200a and 1200b, and storage devices 1300a and 1300b, and may further include an image capturing device 1410, a user input device 1420, a sensor 1430, a communication device 1440, a display 1450, a speaker 1460, a power supplying device 1470 and a connection interface 1480.

The main processor 1100 may control overall operation of the system 1000, and more specifically, operation of other components included in the system 1000. The main processor 1100 may be implemented as a general-purpose processor, a dedicated processor, or an application processor. The main processor 1100 may include an OTP controller implemented as a scan control flip-flop described with reference to FIGS. 1 to 8.

The main processor 1100 may include one or more CPU cores 1110, and may further include a controller 1120 for controlling the memories 1200a and 1200b or the storage devices 1300a and 1300b. In an exemplary embodiment, the main processor 1100 may further include an accelerator block 1130 which may be a dedicated circuit for high-speed data operation such as artificial intelligence (AI) data operation. The accelerator block 1130 may include a graphics processing unit (GPU), a neural processing unit (NPU), or a data processing unit (DPU), and may be implemented as a chip physically independent from other components of the main processor 1100.

The memories 1200a and 1200b may be used as the main memory device of the system 1000, and may include volatile memory such as SRAM or DRAM, and alternatively, the memories 1200a and 1200b may also include non-volatile memory such as flash memory, PRAM or RRAM. The memories 1200a and 1200b may be implemented in the same package as the main processor 1100.

The storage devices 1300a and 1300b may function as non-volatile storage devices storing data regardless of whether power is supplied or not, and may have a relatively large storage capacity as compared to the memories 1200a and 1200b. The storage devices 1300a and 1300b may include storage controllers 1310a and 1310b and non-volatile memory (NVM) storage 1320a and 1320b storing data under the control of the storage controllers 1310a and 1310b. The nonvolatile memories 1320a and 1320b may include a V-NAND flash memory having a 2-dimensional (2D) structure or a 3-dimensional (3D) structure, and may include other types of nonvolatile memory such as PRAM or RRAM.

The storage devices 1300a and 1300b may be included in the system 1000 in a state physically separated from the main processor 1100, or may be implemented in the same package as the main processor 1100. Also, the storage devices 1300a and 1300b may have the same shape as a solid state device (SSD) or a memory card, and accordingly, the storage devices 1300a and 1300b may be connected so as to be attached to and detached from other components of the system 1000 through an interface such as a connection interface 1480 to be described later. Such storage devices 1300a and 1300b may be configured devices to which standard protocols such as universal flash storage (UFS), embedded multi-media card (eMMC), or non-volatile memory express (NVMe) are applied, but an exemplary embodiment thereof is not limited thereto.

The photographing device 1410 may obtain a still image or a video, and may be configured as a camera, a camcorder, or a webcam. The user input device 1420 may receive various types of data input from a user of the system 1000, and may include a touch pad, a keypad, a keyboard, a mouse, or a microphone. The sensor 1430 may detect various types of physical quantities obtained from an external entity of the system 1000, and may convert the sensed physical quantities into electrical signals. The sensor 1430 may be configured as a temperature sensor, a pressure sensor, an illuminance sensor, a position sensor, an acceleration sensor, a biosensor, or a gyroscope.

The communication device 1440 may transmit and receive signals between other devices present externally of the system 1000 according to various communication protocols. The communication device 1440 may be implemented including an antenna, a transceiver, or a modem (MODEM). The display 1450 and the speaker 1460 may function as output devices outputting visual information and auditory information to a user of the system 1000. The power supply device 1470 may appropriately convert power supplied from a battery embedded in the system 1000 or an external power source and may supply the power to each component of the system 1000.

The connection interface 1480 may provide a connection between the system 1000 and an external device connected to the system 1000 to exchange data with the system 1000. The connection interface 1480 may be implemented as various interface methods such as advanced technology attachment (ATA), serial ATA (SATA), external SATA (e-SATA), small computer small interface (SCSI), serial attached SCSI (SAS), peripheral component interconnection (PCI), PCIe (PCI express), NVMe (NVM express), IEEE 1394, universal serial bus (USB), secure digital (SD) card, multi-media card (MMC), embedded multi-media card (eMMC), Universal Flash Storage (UFS), embedded universal flash storage (eUFS), compact flash (CF) card interface, or the like.

As the test scheme of the SoC becomes important, the corresponding design method may be applied to product groups in which secure DFT may be emphasized, including automotive products.

Figure 10:
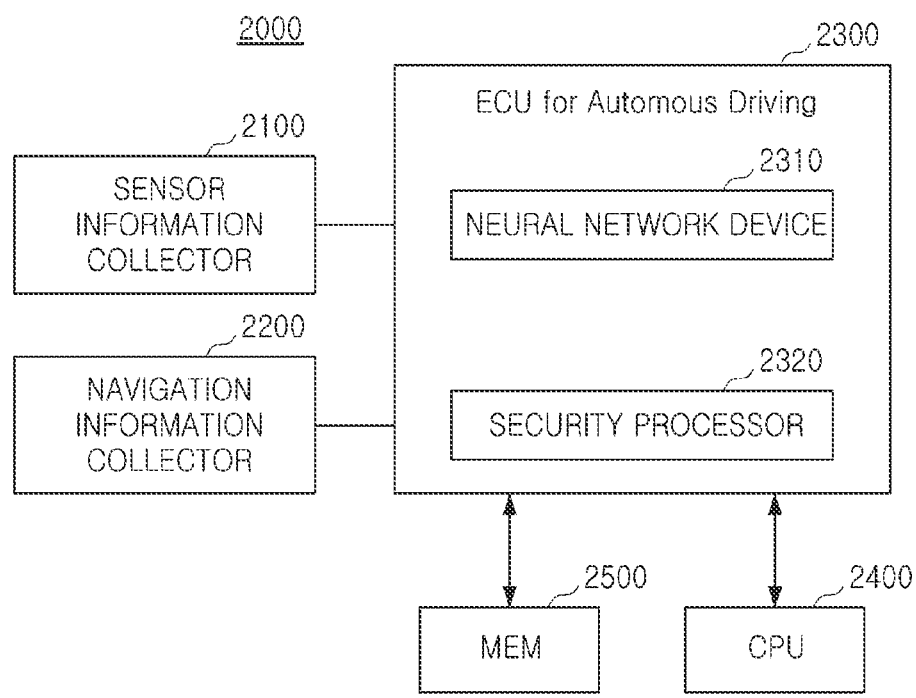
FIG. 10 is a block diagram illustrating a vehicle control system according to an exemplary embodiment of the present disclosure.

FIG. 10 is a block diagram illustrating a vehicle control system according to an exemplary embodiment. Referring to FIG. 10, a vehicle control system 2000 for autonomous driving may include a sensor information collecting device 2100, a navigation information collecting device 2200, an electronic control unit 2300 (ECU) for autonomous driving, a central processing unit 2400, and a memory device 2500.

Also, the electronic control unit 2300 for autonomous driving may include a neural network device 2310 and a cryptographic device 2320. The electronic control unit 2300 may include an OTP memory configured to store secure data and an OTP controller implemented with a scan control flip-flop maintaining secure data in a test/debugging operation as described with reference to FIGS. 1 to 8.

The neural network device 2310 may perform a neural network operation using various types of image information and audio information, and may generate information signals such as an image recognition result and a voice recognition result based on an execution result.

The sensor information collecting device 2100 may include devices collecting various types of image information and audio information of a camera or a microphone, and may provide the information to the electronic control unit 2300 for autonomous driving. The navigation information collecting device 2200 may provide various types of information (e.g., location information, or the like) related to vehicle driving to the electronic control unit 2300 for autonomous driving. The neural network device 2310 may generate information signals by receiving information from the sensor information collecting device 2100 or the navigation information collecting device 2200, and executing various types of neural network models. When the sensor information collecting device 2100 includes a camera or a microphone, a cryptographic device 2320 of the autonomous driving module 2300 may be a security processing for voice data or image data from the sensor information collecting device 2100. A decryption operation and an ECC operation may be performed. As described above, the cryptographic device 2320 may store encrypted data and metadata/ECC data in the memory device 2500.

In FIG. 10, the aforementioned exemplary embodiment may be applied to an autonomous driving system. However, the exemplary embodiments may be applied to products requiring a security function in a camera sensor, such as IoT, a surveillance camera, and the like.

As a design method for controlling DFT/Debug related functions for each stage of development of the product, OTP may be generally used to proceed a stage of assembling essential products required by custom SoC customers through an external company and to configure secure DFT for important information of a product to not leak through a SCAN. DFT/Debug access may be controlled according to this data. During a scan test of the OTP controller, the related data may be controlled to not be toggled to an unintended value and to not affect the test. There may be a difference in the method of controlling secure DFT depending on the operation mode of the product. In a normal Mode, intended data may be stored in the OTP to control the DFT/Debug function according to the product development stage. In other words, it may be possible to control according to OTP data without clock gating or feedback loop circuit. In the SCAN mode, after reading OTP data, data may be maintained only when DFT/Debug related functions are enabled. In addition to excluding from the SCAN chain, data may be maintained by additional logic design of clock gating or feedback loop during the scan test. In designing a secure DFT according to a life-cycle of a product using the OTP controller, the OTP controller may be designed to maintain data in the case of flip-flops affecting the scan test.

According to the aforementioned exemplary embodiments, a system on a chip, and a method of designing the same may, by maintaining a value of a specific register in scan mode, improve availability of the test.

Also, a system on a chip, and a method of designing the same may, by maintaining a value of a specific register in scan mode, improve performance of DFT verification.

While exemplary embodiments have been illustrated and described above, it will be apparent to those skilled in the art that modifications and variations could be made without departing from the scope of the present disclosure as defined by the appended claims.

What is claimed is:

1. A system on chip, comprising:
a one-time programmable (OTP) memory configured to store secure data;
an OTP controller including at least one shadow register configured to read the secure data from the OTP memory and to store the secure data;
a power management unit configured to receive an operation mode signal from an external device and to output test mode information indicating whether an operation mode is a test mode according to the operation mode signal and a test valid signal corresponding to the secure data; and
a test circuit configured to receive the test mode information from the power management unit, to receive test data from the external device, and to output a scan mode signal and a test mode signal according to the test data and the test deactivation signal,
wherein the test deactivation signal corresponds to development state data indicating a chip development state in the secure data.

2. The system on chip of claim 1, wherein the secure data includes a security key, trim data, recovery data, and the development state data.

3. The system on chip of claim 1, wherein the at least one shadow register includes at least one scan control flip-flop configured to store data not affecting the scan test.

4. The system on chip of claim 3, wherein the at least one scan control flip-flop is implemented as a feedback loop flip-flop.

5. The system on chip of claim 4, wherein the feedback loop flip-flop includes:
a flip-flop configured to output the data in response to a clock; and
a multiplexer configured to output one of a combinational logic signal and an output signal of the flip-flop in response to a scan mode signal.

6. The system on chip of claim 3, wherein the at least one scan control flip-flop is implemented as a gating clock flip-flop.

7. The system on chip of claim 6, wherein the gating clock flip-flop includes:
a flip-flop configured to output data of combinational logic in response to a gating clock; and
an AND operation circuit configured to receive a scan mode signal and a clock and to output the gating clock.

8. The system on chip of claim 1, wherein the power management unit includes:
an operation mode decoder configured to receive the operation mode signal and a reset signal, and to determine an operation mode corresponding to the operation mode signal; and
an operation circuit configured to output the test mode information by performing an AND operation on the test valid signal and an output signal of the operation mode decoder.

9. The system on chip of claim 8, wherein the test valid signal is output from the at least one shadow register.

10. The system on chip of claim 1, wherein
wherein the at least one shadow register includes a plurality of flip-flops, and
wherein, among the plurality of flip-flops, the flip-flop affecting the scan test is excluded from the scan chain.

11. A method of designing a system on chip, the method comprising:
defining one-time programmable (OTP) data in a specification;
indicating whether the OTP data affects test or debugging access; and
designing a shadow register using scan control flip-flops in storing the OTP data when the OTP data affects the test or debugging access,
wherein each of the scan control flip-flops is designed such that output data does not affect the scan operation in the scan mode.

12. The method of claim 11, further comprising:
designing a shadow register using flip-flops when the OTP data does not affect the test or debugging access.

13. The method on chip of claim 11, wherein the scan control flip-flops are excluded from the scan chain.

14. The method on chip of claim 11, wherein each of the scan control flip-flops is implemented as a feedback loop flip-flop.

15. The method on chip of claim 11, wherein each of the scan control flip-flops is implemented as a gating clock flip-flop.

\* \* \* \* \*